(12) United States Patent
Lin et al.

(10) Patent No.: US 11,688,654 B2
(45) Date of Patent: Jun. 27, 2023

(54) TEST LINE STRUCTURE, SEMICONDUCTOR STRUCTURE AND METHOD FOR FORMING TEST LINE STRUCTURE

(71) Applicant: Taiwan Semiconductor Manufacturing Company, Ltd., Hsinchu (TW)

(72) Inventors: Yen-Chun Lin, Hsinchu (TW); Chung-Yi Lin, Hsinchu County (TW); Yen-Sen Wang, Hsinchu (TW); Bao-Ru Young, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 86 days.

(21) Appl. No.: 17/331,675

(22) Filed: May 27, 2021

(65) Prior Publication Data

US 2022/0384279 A1    Dec. 1, 2022

(51) Int. Cl.
*H01L 21/66* (2006.01)
*H01L 23/528* (2006.01)
*H01L 23/00* (2006.01)
*G06F 30/3947* (2020.01)

(52) U.S. Cl.
CPC .......... *H01L 22/32* (2013.01); *G06F 30/3947* (2020.01); *H01L 22/14* (2013.01); *H01L 23/528* (2013.01); *H01L 24/05* (2013.01)

(58) Field of Classification Search
CPC ....... H01L 22/32; H01L 23/528; H01L 24/05; H01L 22/34
See application file for complete search history.

(56) References Cited

U.S. PATENT DOCUMENTS

| | | | |
|---|---|---|---|
| 6,809,540 B2* | 10/2004 | Beech | H01L 22/34 324/757.01 |
| 10,593,604 B1* | 3/2020 | Lam | H01L 22/12 |
| 10,978,438 B1* | 4/2021 | Lam | H01L 29/41775 |
| 2007/0296439 A1* | 12/2007 | Feustel | H01L 22/34 324/754.03 |
| 2011/0092030 A1* | 4/2011 | Or-Bach | H01L 21/823828 438/129 |
| 2018/0157782 A1* | 6/2018 | Rossi | G06F 30/392 |

(Continued)

OTHER PUBLICATIONS

Christopher Hess, et al, Scribe Characterization Vehicle Test Chip for Ultra Fast Product Wafer Yield Monitoring, 06 (Year: 2006).*

*Primary Examiner* — Mamadou L Diallo

(74) *Attorney, Agent, or Firm* — McClure, Qualey & Rodack, LLP

(57) ABSTRACT

Test line structures are provided. A test line structure includes a semiconductor substrate, a plurality of diagnosis units and a plurality of first micro pad units. The diagnosis units are formed over the semiconductor substrate. Each of the diagnosis units includes a first interconnect structure having a first routing pattern. The first interconnect structures of the diagnosis units are connected in series to form a first test chain through the first micro pad units, and each of the first micro pad units is configured to connect the first interconnect structures of two adjacent diagnosis units in the first test chain. The first routing patterns of the first interconnect structures in the diagnosis units are different.

20 Claims, 14 Drawing Sheets

(56) References Cited

U.S. PATENT DOCUMENTS

2019/0123022 A1* 4/2019 Teig .................... H01L 25/0657
2020/0304063 A1* 9/2020 Morad ................. H01L 31/052
2021/0097228 A1* 4/2021 Lin ........................ H01L 24/11

* cited by examiner

TEST LINE STRUCTURE, SEMICONDUCTOR STRUCTURE AND METHOD FOR FORMING TEST LINE STRUCTURE

BACKGROUND

The yield in the manufacturing of integrated circuits (ICs) is affected by many factors. To improve the yield, physical failure analysis (PFA) needs to be performed on at least some failed dies to find the root cause of the problem. Since the failed dies may have various different problems, the major failure that most affects the yield needs to be made a high priority.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
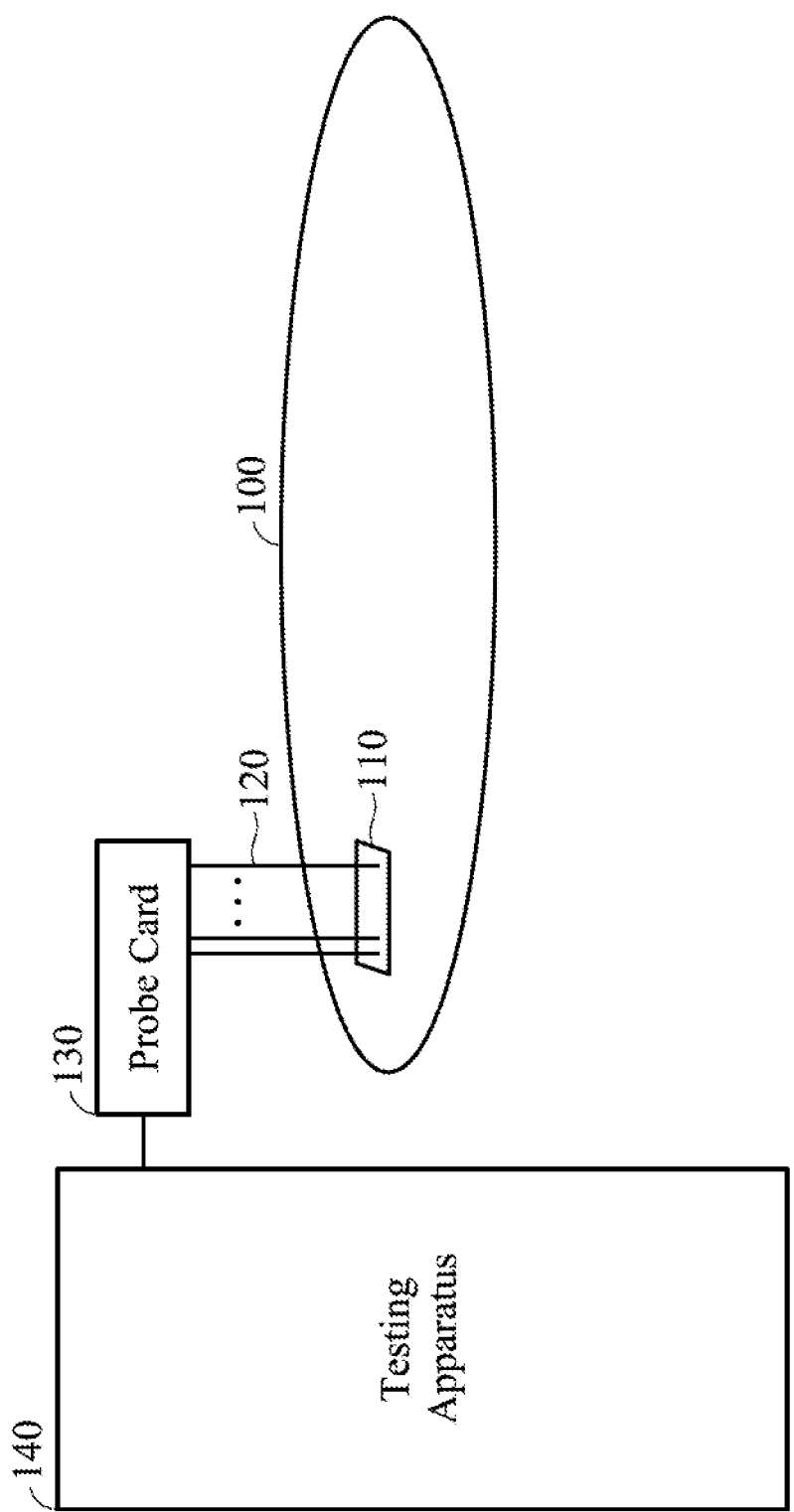
FIG. 1 shows an example illustrating a wafer acceptance test for a semiconductor wafer, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In an electronic circuit design process, one or more electronic design automation (EDA) tools may be utilized to design, optimize, and verify semiconductor device designs, such as circuit designs in a semiconductor device, such as a semiconductor chip. A register-transfer level (RTL) design of a circuit may be performed, for example, by software tools which utilize a high-level software language (e.g., Verilog, or the like) to describe or otherwise model the circuit. The RTL design may then proceed to a synthesis process, in which the RTL design may be translated to an equivalent hardware or circuit-level implementation file. The synthesis results may then be used by placement and routing tools to create a physical layout of the semiconductor device (e.g., a semiconductor chip). During placement, a placer tool may produce a placement layout based on the synthesized circuit design. The placement layout includes information indicating physical positions of various circuit elements of the semiconductor device. For example, the placer tool may generate a plurality of cells which correspond to, or otherwise implement, the various circuit elements of the semiconductor device. The cells may include geometric shapes which correspond to various features of semiconductor devices, including, for example, diffusion layers, polysilicon layers, metal layers, and/or interconnections between layers.

After the placement of the device is completed, clock-tree synthesis (CTS) may be performed, in which a clock tree is developed to distribute (e.g., by electrical networks) clock signals from a common point to all of the circuit elements that are to receive a clock signal. Routing is typically performed after CTS. During routing, wires or interconnections may be formed to connect the various circuit elements of the placement layout. In some embodiments, the placement and routing operations are performed by an auto placement and routing (APR) tool.

After routing, various checks and analysis are performed on the design of the placement layout, including, for example, design rule checks (DRCs), design rule verification, timing analysis, critical path analysis, static and dynamic voltage drop analysis, and the like. A tape-out process is then performed and optical masks are developed to fabricate the semiconductor device or circuit. During the tape-out process, the database file of the circuit (e.g., an integrated circuit (IC)) is converted into a Graphic Database System (GDS) file which is used to make various layers of masks for manufacturing the ICs on a semiconductor wafer.

During semiconductor manufacturing process, the performance of various interconnects and devices of the semiconductor wafer should be evaluated by a wafer acceptance test (WAT) after the manufacturing process. Furthermore, when the semiconductor wafer is completed through the semiconductor processing, a test is performed at a stage known as the wafer acceptance test. At the wafer acceptance test, probes may be placed onto pads coupled to various devices and interconnect structures within the ICs that are formed on the semiconductor wafer, and certain measurements may be made. If the performance measured at the wafer acceptance test is not acceptable, then the semiconductor wafer, which has been processed through many expensive and time consuming processing steps, and the materials used to perform the semiconductor manufacturing process, are wasted. At the wafer acceptance test, defect diagnosis may be implemented as part of the semiconductor manufacturing process to detect defects on the interconnect and devices of the semiconductor wafer.

Furthermore, the wafer acceptance test is conducted to derive the product yield. Prior to the wafer acceptance test, some test line structures (i.e. test keys and test pads) electrically connected thereto have been formed in scribe lines around the dies or non-product area of the wafer. The test line structures are electrically connected to an external circuit or probes of a probe card through the test pads to check the quality of the various processes in the wafer acceptance test. Therefore, the main purposes of the wafer acceptance test are to confirm the stability of the semiconductor process as well as to enhance the yield of ICs. By means of the wafer acceptance test, the quality and the stability of the semiconductor wafers are somewhat ensured.

FIG. 1 shows an example illustrating a wafer acceptance test for a semiconductor wafer 100, in accordance with some embodiments of the disclosure. In FIG. 1, one or more test line structures 110 are formed on the semiconductor wafer 100. In some embodiments, the test line structures 110 are formed in the scribe lines (not shown) between multiple dies (not shown) of the semiconductor wafer 100. In some embodiments, the test line structures 110 are formed in a test range at the edge of the semiconductor wafer 100. The test line structures 110 can be used for tests or other functions, as discussed below. Each test line structure 110 includes multiple test pads, such as wafer acceptance test array pads and optical critical dimension (OCD) pads.

In FIG. 1, a probe card 130 is used to perform a wafer acceptance test. The probe card 130 includes a number of probes 120. It is understood that there are many types of probes 120, such as electrical probe pins, optical probes, and/or magnetic probes. The probes 120 of the probe card 130 are made contact with the test line structures 110, and the positions of the test pads of the test line structures 110 have to be identified first. After the probes 120 of the probe card 130 contact the test pads of the test line structures 110, the probe card 130 sequentially and repeatedly applies test signals to the test line structures 110 through the probes 120, and then receives responses from the test line structures 110 through the probes 120. The probe card 130 is usually connected to a testing apparatus (tester) 140, and the testing apparatus 140 is configured to perform various test programs and record the test results of the semiconductor wafer 100. In a Back End of Line (BEOL) test, the test line structures 110 can provide process stability on various processing parameters.

In some embodiments, the test results of the semiconductor wafer 100 are used to modify processing parameters for yield improvement of ICs. In some embodiments, upon finishing the tests, failed dies are inked and/or faulty process results are identified through the testing apparatus 140. The semiconductor wafer 100 is then diced along the scribe lines. Therefore, integrated circuit devices (chips) are created.

In some embodiments, the semiconductor wafer 100 uses various interconnect structures for interconnecting circuitry on the IC. The interconnect structure includes a number of metal layers separated by one or more layers of interlayer dielectric. In some embodiments, it is desired that the thickness and width of the metal line in the interconnect structures be of the proper size to insure such things as reliability and a proper sheet resistance. Therefore, the test line structures 110 can provide structures by which these measurements can be made outside of the dies.

Figure 2:
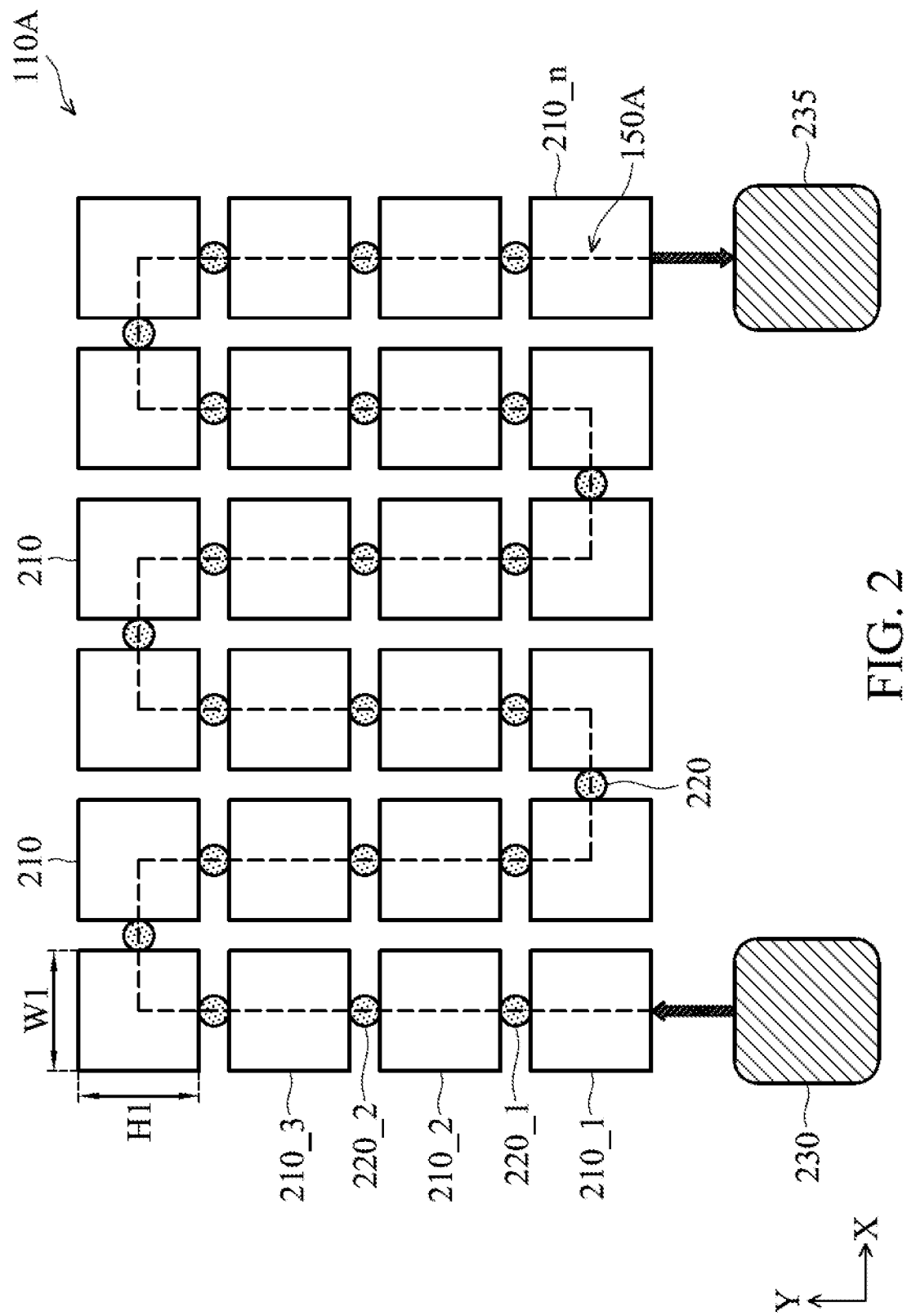
FIG. 2 shows a top view of a test line structure, in accordance with some embodiments of the disclosure.

FIG. 2 shows a top view of a test line structure 110A, in accordance with some embodiments of the disclosure. The test line structure 110A is implemented in a semiconductor wafer, and the test line structure 110A is used to obtain the characteristics of three consecutive metal layers and two via layers between the three consecutive metal layers. The details of the three consecutive metal layers and the two via layers are described below.

The test line structure 110A includes multiple diagnosis units 210 and multiple micro pad units 220. Each diagnosis unit 210 includes an interconnect structure to be tested, and a routing path of the interconnect structure has a respective routing pattern formed by the three consecutive metal layers and the two via layers. In other words, the interconnect structures of the diagnosis units 210 have different routing patterns. In some embodiments, the test line structure 110A is disposed in a scribe line of the semiconductor wafer. In some embodiments, the test line structure 110A is arranged in a test range at the edge of the semiconductor wafer. The details of the diagnosis unit 210 is described below.

The diagnosis unit 210 has a width W1 along a X-direction and a height H1 along a Y-direction. In some embodiments, the width W1 is equal to the height H1, e.g., 10 μm. In some embodiments, the area of the diagnosis unit 210 formed by the width W1 and the height H1 is determined according to resolution of a testing apparatus (e.g., 140 of FIG. 1) for the wafer acceptance test.

In FIG. 2, the diagnosis units 210 are arranged in a array having 4 rows and 6 columns. It should be noted that the number of rows and columns are provided as an example, and are not intended to limit the disclosure. In some embodiments, the diagnosis units 210 are arranged in a line.

In FIG. 2, the diagnosis units 210 are connected in series to form a test chain 150A between the test pads 230 and 235 through the micro pad units 220. For example, the diagnosis unit 210_1 is a first diagnosis unit (i.e., the head diagnosis unit) in the test chain 150A, and the diagnosis unit 210_n is the last diagnosis unit (i.e., the tail diagnosis unit) in the test chain 150A. Furthermore, each micro pad unit 220 is configured to connect the interconnect structures of two adjacent diagnosis units 210. For example, the interconnect structure of the diagnosis unit 210_1 is coupled to the interconnect structure of the diagnosis unit 210_2 through the micro pad unit 220_1, and the interconnect structure of the diagnosis unit 210_2 is coupled to the interconnect structure of the diagnosis unit 210_3 through the micro pad unit 220_2, and so on. By using the micro pad units 220, all routing paths in the interconnect structures of the diagnosis units 210 are connected in series to form the test chain 150A. The details of the micro pad unit 220 is described below.

The test pad 230 is an input pad and the test pad 235 is an output pad for testing the test chain 150A. In a wafer acceptance test, a testing apparatus (e.g. 140 of FIG. 1) uses a probe card (e.g. 130 of FIG. 1) to test the test line structure 110A. In such embodiment, a first probe of the probe card is used to contact the test pad 230, and a second probe of the probe card is used to contact the test pad 235. In some embodiments, the test pads 230 and 235 are connected to the diagnosis units 210_1 and 210_n through the respective metal lines, respectively. In some embodiments, the test pads 230 and 235 are connected to the diagnosis units 210_1 and 210_n further through the additional micro pad units.

In the wafer acceptance test, the testing apparatus provides a test signal (e.g., voltage or current) to the test pad 230 through the first probe of the probe card. After providing the test signal to the diagnosis unit 210_1 through the test pad 230, the test signal is transferred in the routing path of the diagnosis unit 210_1, and then the test signal is provided to the diagnosis unit 210_2 (i.e., the next diagnosis unit) through the micro pad unit 220_1. Next, the test signal is transferred in the routing path of the diagnosis unit 210_2, and then the test signal is provided to the diagnosis unit 210_3 (i.e., the next diagnosis unit) through the micro pad unit 220_2, and so on. Finally, along the test chain 150A, the test signal is provided to the diagnosis unit 210_n. Next, the test signal is transferred in the routing path of the diagnosis unit 210_n, and then the test signal is provided to the test pad 235. The testing apparatus is configured to measure the test signal from the test pad 235 through the second probe of the probe card.

After obtaining the test signal from the test pad 235, the testing apparatus analysis the obtained signal to automatically identify or detect defects (e.g., insufficient space and/or line width margins, or the like) in the test line structure 110A. If the defects are present, the defects are analyzed, so as to tune the processing parameters for yield improvement. In some embodiments, in order to analyze the defects, the testing apparatus is further configured to detect one or more diagnosis units 210 by using the probes of the probe card to contact the corresponding micro pad units 220. For example, by using a first additional probe of the probe card to contact the micro pad unit 220_1 and using a second additional probe of the probe card to contact the micro pad unit 220_2, the testing apparatus is configured to provide a signal to the diagnosis unit 210 through the micro pad unit 220_2. Next, the signal is transferred in the routing path of the diagnosis unit 210_2, and then the testing apparatus obtains and analyzes the signal from the micro pad unit 220_2.

Figure 3:
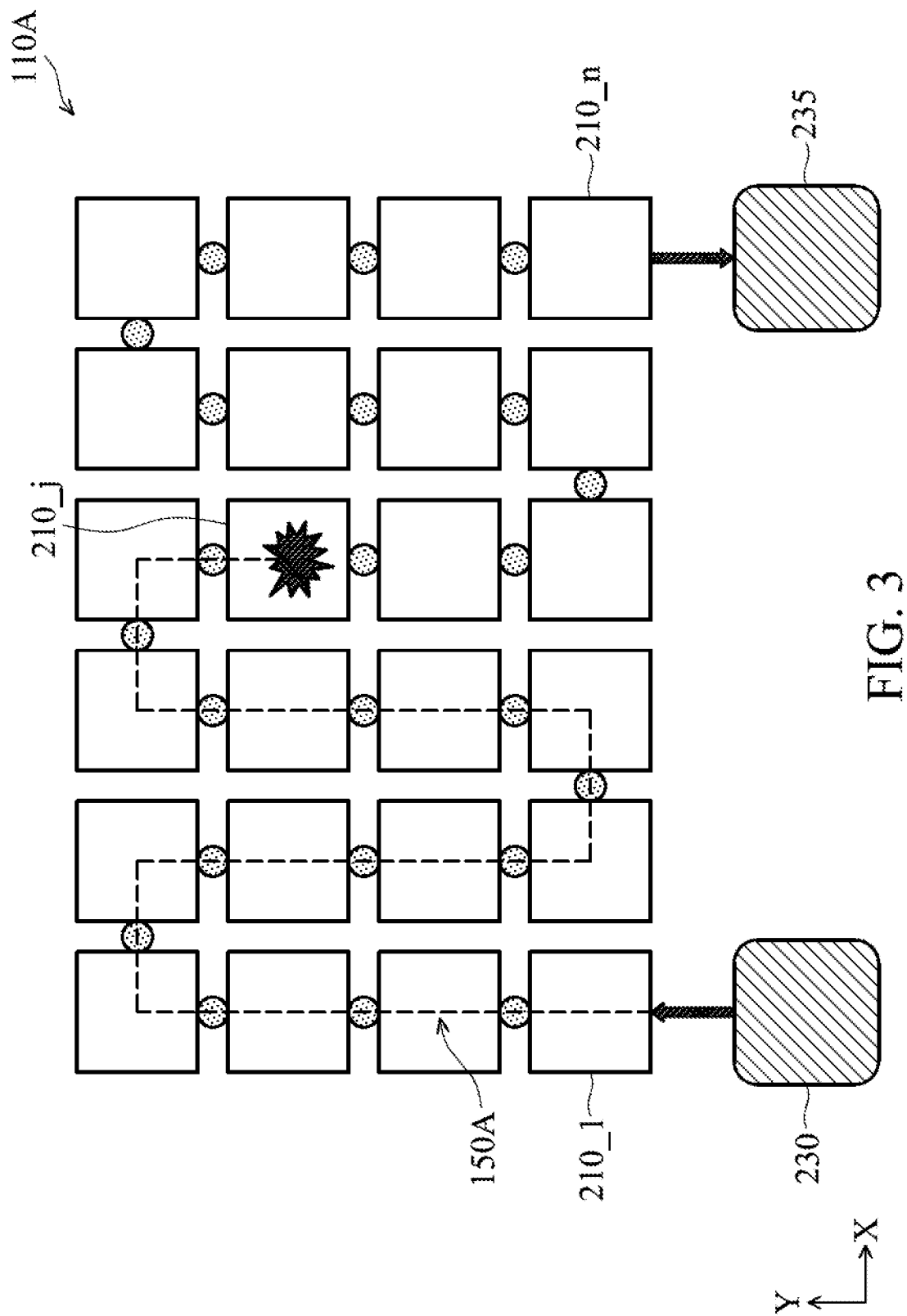
FIG. 3 shows an example illustrating that the test chain is break in the diagnosis unit.

If no signal is obtained from the test pad 235, the testing apparatus determines that there is a break in the test chain 150A. Next, a defect inspection (e.g., an optical-based inspection) is performed to detect where the test chain 150A is break. Referring to FIG. 3, FIG. 3 shows an example illustrating that the test chain 150A is break in the diagnosis unit 210_j. After detecting that the test chain 150A is break in the diagnosis unit 210_j, the routing path of interconnect structure in the diagnosis unit 210_j is analyzed. Once the cause of the break in the test chain 150A is obtained, the related processing parameters will be further corrected for yield improvement.

Figure 4:
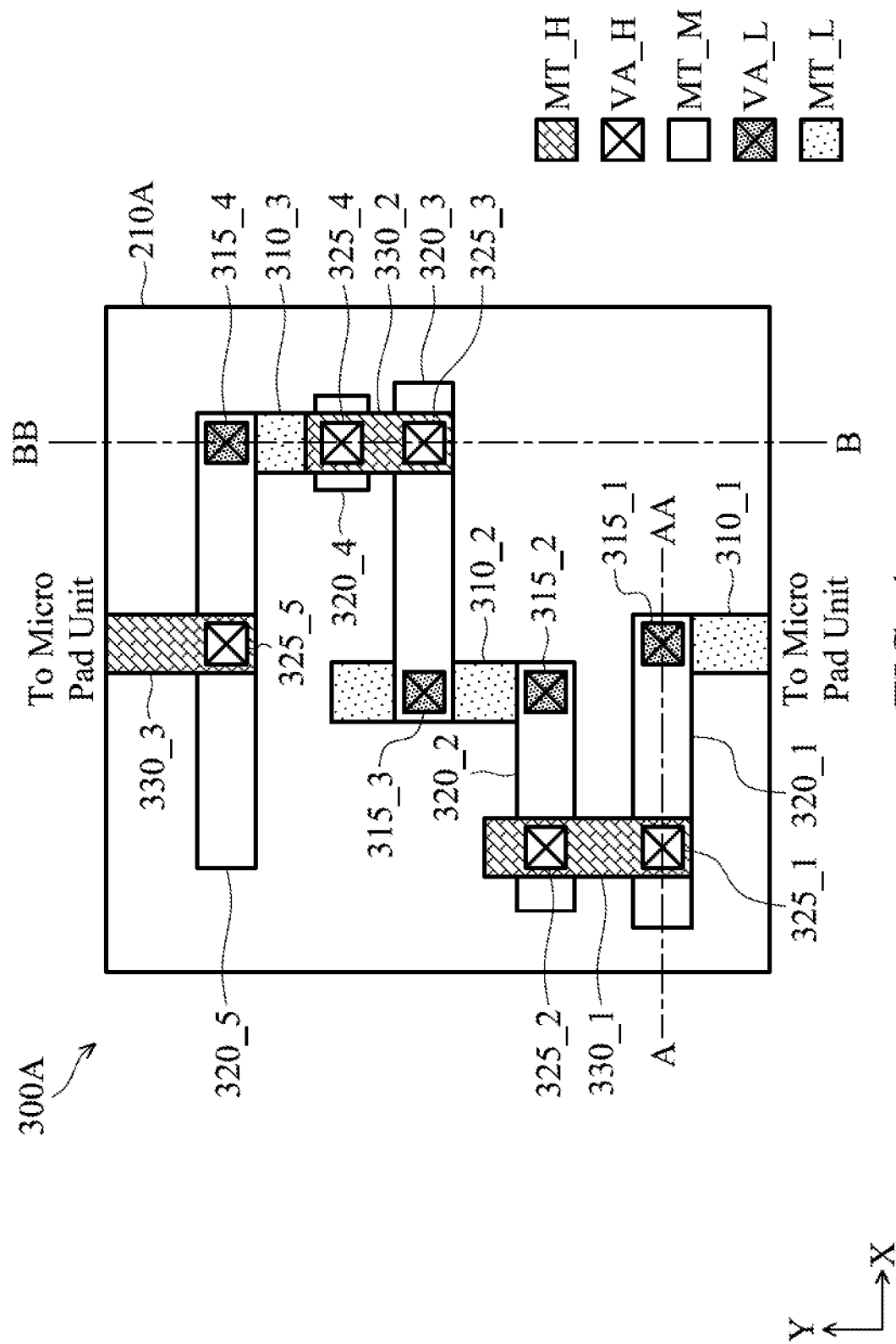
FIG. 4 shows a top view illustrating an interconnect structure of a diagnosis unit, in accordance with some embodiments of the disclosure.

FIG. 4 shows a top view illustrating an interconnect structure 300A of a diagnosis unit 210A, in accordance with some embodiments of the disclosure. A routing path of the interconnect structure 300A has a respective routing pattern formed by a first metal layer MT_L, a second metal layer MT_M, a third metal layer MT_H, a first via layer VA_L and a second via layer VA_H. As described above, The first metal layer MT_L, the second metal layer MT_M and the third metal layer MT_H are three continuous metal layers.

In FIG. 4, the metal lines 310_1 through 310_3 extending in a Y-direction are formed in the first metal layer MT_L, and the first metal layer MT_L is the lowest metal layer in the diagnosis unit 210A. The metal lines 320_1 through 320_5 extending in a X-direction are formed in the second metal layer MT_M, and the second metal layer MT_M is the middle metal layer in the diagnosis unit 210A. In some embodiments, the second metal layer MT_M is the main routing layer in the diagnosis unit 210A. The metal lines 330_1 through 330_3 extending in the Y-direction are formed in the third metal layer MT_H, and the third metal layer MT_H is the highest metal layer in the diagnosis unit 210A. The vias 315_1 through 315_4 are formed in the first via layer VA_L, and the first via layer VA_L is formed between the first metal layer MT_L and the second metal layer MT_M. The vias 325_1 through 325_5 are formed in the second via layer VA_H, and the second via layer VA_H is formed between the second metal layer MT_M and the third metal layer MT_H. In FIG. 4, the extension direction of the metal lines 310_1 through 310_3, the metal lines 320_1 through 320_5 and the metal lines 330_1 through 330_3 are provided as an example, and are not intended to limit the disclosure.

In the diagnosis unit 210A, the metal line 310_1 of the first metal layer MT_L and the metal line 330_3 of the third metal layer MT_H are used to connect the corresponding micro pad units 220, respectively. In other words, the metal lines 310_1 and 330_3 are assigned as the input/output terminals of the diagnosis unit 210A for connecting the micro pad unit.

In FIG. 4, the routing path between the metal line 310_1 and the metal line 330_3 in the interconnect structure 300A is formed according to APR routing layout. The APR routing layout is provided by the EDA tool for reliability and a proper sheet resistance of the metal lines in the metal layers MT_L through MT_H and the vias in the via layers VA_L and VA_H. For example, the APR procedure is performed to randomly arrange the metal lines and/or the vias densely and sparsely according various constraints, so as to provide various routing configurations. Slimily, the metal lines in the metal layers MT_L through MT_H that are assigned as the input/output terminals may be determined in the APR procedure. In some embodiments, which metal layer MT_L, MT_M or MT_H is assigned as the input or output terminal is random.

The width and the depth of metal lines in the metal layers MT_L through MT_H and the vias in the via layers VA_L and VA_H are determined according to the related processing rule. For example, the metal lines in the metal layers MT_L through MT_H may have the same width and/or depth. In some embodiments, the metal lines in the metal layers MT_L through MT_H may have different widths and/or depths.

Figure 5A:
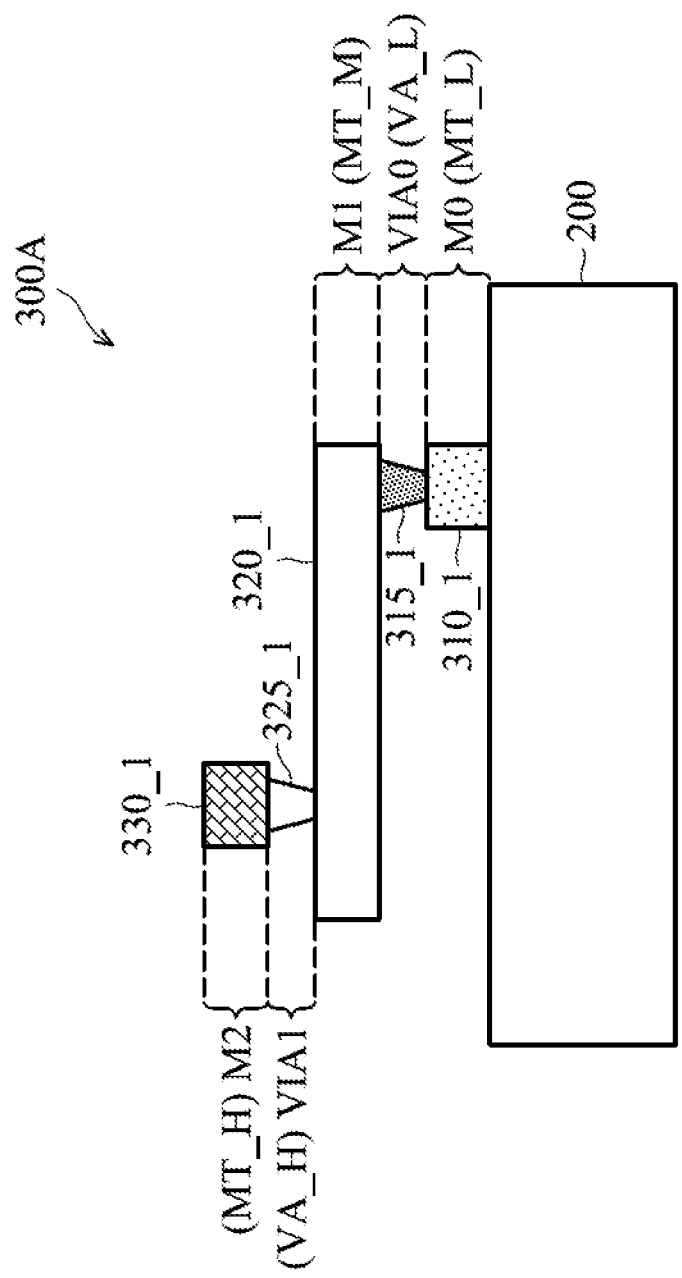
FIG. 5A illustrates a cross-sectional view of the interconnect structure of the diagnosis unit along line A-AA in FIG. 4, in accordance with some embodiments of the disclosure.

FIG. 5A illustrates a cross-sectional view of the interconnect structure 300A of the diagnosis unit 210A along line A-AA in FIG. 4, in accordance with some embodiments of the disclosure. The interconnect structure 300A is formed over a semiconductor substrate 200. In some embodiments, the semiconductor substrate 200 is a Si substrate. In some embodiments, the material of the semiconductor substrate 200 is selected from a group consisting of bulk-Si, SiP, SiGe, SiC, SiPC, Ge, SOI-Si, SOI-SiGe, III-VI material, or a combination thereof.

In FIG. 5A, the metal line 310_1 is formed in a metal layer M0 (i.e., the first metal layer MT_L) over the semiconductor substrate 200, and the metal layer M0 is the lowermost metal layer (i.e., the bottom metal layer). The via 315_1 is formed in a via layer VIA0 (i.e., the first via layer VA_L) over the metal layer M0, and the via layer VIA0 is the lowermost via layer on the metal layer M0. Furthermore, the via 315_1 is disposed on the metal line 310_1. The metal line 320_1 is formed in a metal layer M1 (i.e., the second metal layer MT_M) over the via layer VIA0. Furthermore, the metal line 320_1 is disposed on the via 315_1. The via 325_1 is formed in a via layer VIA1 (i.e., the second via layer VA_H) over the metal layer M1. Furthermore, the via 325_1 is disposed on the metal line 320_1. The metal line 330_1 is formed in a metal layer M2 (i.e., the third metal layer MT_H) over the via layer VIA1. Furthermore, the metal line 330_1 is disposed on the via 325_1. In FIG. 5A, a conductive path (e.g., the routing path) is formed form the metal line 310_1 to the metal line 330_1 or form the metal line 330_1 to the metal line 310_1.

As described above, the metal layers M0 through M2 are three continuous metal layers over the semiconductor substrate 200. In order to simplify the description, other related layers (e.g., the etch stop layer and inter-metal dielectric (IMD) layer) will be omitted in FIG. 5A. Furthermore, the metal lines in the metal layers M0 through M2 and the vias in the via layer VIA0 and VIA1 are formed by conductive material, such as copper, copper alloy, nickel, gold, tungsten, aluminum, or the like.

Figure 5B:
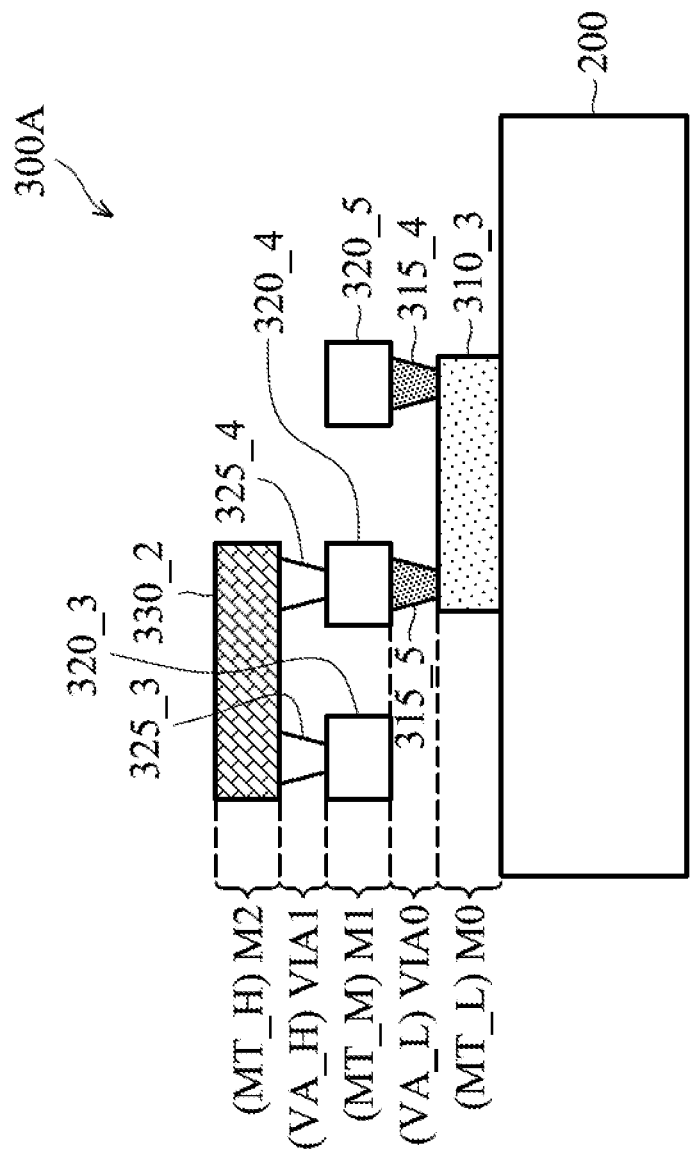
FIG. 5B illustrates a cross-sectional view of the interconnect structure of the diagnosis unit along line B-B in FIG. 4, in accordance with some embodiments of the disclosure.

FIG. 5B illustrates a cross-sectional view of the interconnect structure 300A of the diagnosis unit 210A along line B-B in FIG. 4, in accordance with some embodiments of the disclosure. In order to simplify the description, other related layers (e.g., the etch stop layer and inter-metal dielectric (IMD) layer) will be omitted in FIG. 5B.

In FIG. 5B, the metal line 310_3 is formed in the metal layer M0 (i.e., the first metal layer MT_L) over the semiconductor substrate 200. The vias 315_4 and 315_5 are formed in the via layer VIA0 (i.e., the first via layer VA_L) and over both ends of the metal line 310_3. The metal line 320_5 is formed in the metal layer M1 (i.e., the second metal layer MT_M) and on the via 315_4. The metal line 320_4 is formed in the metal layer M1 and on the via 315_5. The via 325_4 is formed in the via layer VIA1 (i.e., the second via layer VA_H) and on the metal line 320_4. The metal line 330_2 is formed in the metal layer M2 (i.e., the third metal layer MT_H) and on the via 325_4. The via 325_3 is formed in the via layer VIA1 and below the left side of the metal line 330_2. The metal line 320_3 is formed in the metal layer M1 and below the via 325_3. In FIG. 5B, a conductive path is formed form the metal line 320_5 to the metal line 320_3 or form the metal line 320_3 to the metal line 320_5.

In FIG. 5A and FIG. 5B, no device is formed in the semiconductor substrate 200 and under the interconnect structure 300A. In other words, no device is coupled to the interconnect structure 300A. The interconnect structure 300A is configured to test the routing path among the metal layers M0 through M2 to verify the characteristics of conductive lines of the metal layers M0 through M2 and conductive vias of the via layers VIA1 and VIA2. After obtaining the characteristics of conductive lines and vias, the critical dimension of the conductive lines and the conductive via may be modified, such as line width, line pitch, via width and so on, so as to improve the yield.

Figure 6:
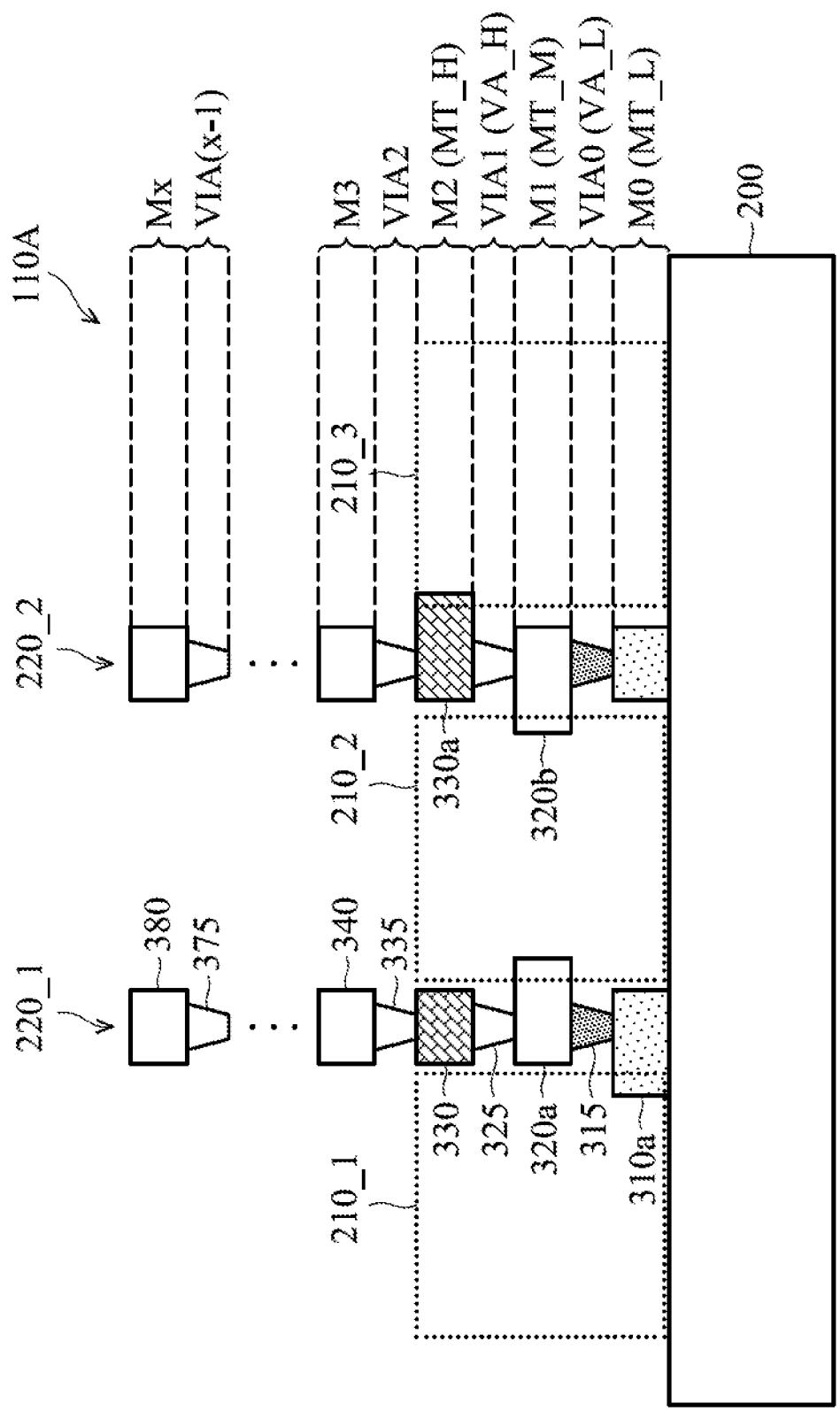
FIG. 6 shows a cross-sectional view of a test line structure of FIG. 2, in accordance with some embodiments of the disclosure.

FIG. 6 shows a cross-sectional view of a test line structure 110A of FIG. 2, in accordance with some embodiments of the disclosure. The test line structure 110A includes the diagnosis units 210_1 through 210_3 and the micro pad units 220_1 and 220_2. The number of diagnosis units and micro pad units are provided as an example, and are not intended to limit the disclosure.

The diagnosis units 210_1 through 210_3 includes the respective interconnect structures (not shown), and each interconnect structure of the diagnosis units 210_1 through 210_3 has the respective routing pattern between the three continuous metal layers M0 through M2, as shown in FIG. 5A and FIG. 5B. Therefore, the test line structure 110A is used to obtain (or test) the characteristics of the metal layers M0 through M2 and the via layers VIA0 and VIA1.

The micro pad unit 220_1 is formed over the semiconductor substrate 200 and between the diagnosis units 210_1 and 210_2, and the micro pad unit 220_2 is formed over the semiconductor substrate 200 and between the diagnosis units 210_2 and 210_3. The micro pad unit 220_1 is configured to connect the interconnect structures of the diagnosis units 210_1 and 210_2, and the micro pad unit 220_2 is configured to connect the interconnect structures of the diagnosis units 210_2 and 210_3. Each of the micro pad units 220_1 and 220_2 has an interconnect structure formed by all metal layers and all via layers used in the related process. For example, the interconnect structures of the micro pad units 220_1 and 220_2 are formed from the lowermost metal layer M0 (i.e., the bottom metal layer) to the uppermost metal layer Mx (i.e., the top metal layer) through the metal layers M1 through M(x−1) and the via layers VIA0 through VIA(x−1). In some embodiments, the test pads 230 and 235 of FIG. 2 are formed in the uppermost metal layer Mx.

In the test line structure 110A, the micro pad unit 220_1 is connected to the interconnect structure of the diagnosis unit 210_1 through the metal line 310a in the metal layer M0, and the micro pad unit 220_1 is connected to the interconnect structure of the diagnosis unit 210_2 through the metal line 320a in the metal layer M1. Furthermore, the micro pad unit 220_2 is connected to the interconnect structure of the diagnosis unit 210_2 through the metal line 320b in the metal layer M1, and the micro pad unit 220_2 is connected to the interconnect structure of the diagnosis unit 210_3 through the metal line 330a in the metal layer M2. As described above, the routing path between the metal lines and the vias in the interconnect structure of each diagnosis unit is formed according to APR routing layout. Thus, according to the routing result, the corresponding metal lines of each micro pad unit is arranged to connect the routing path of the diagnosis unit.

Figure 7:
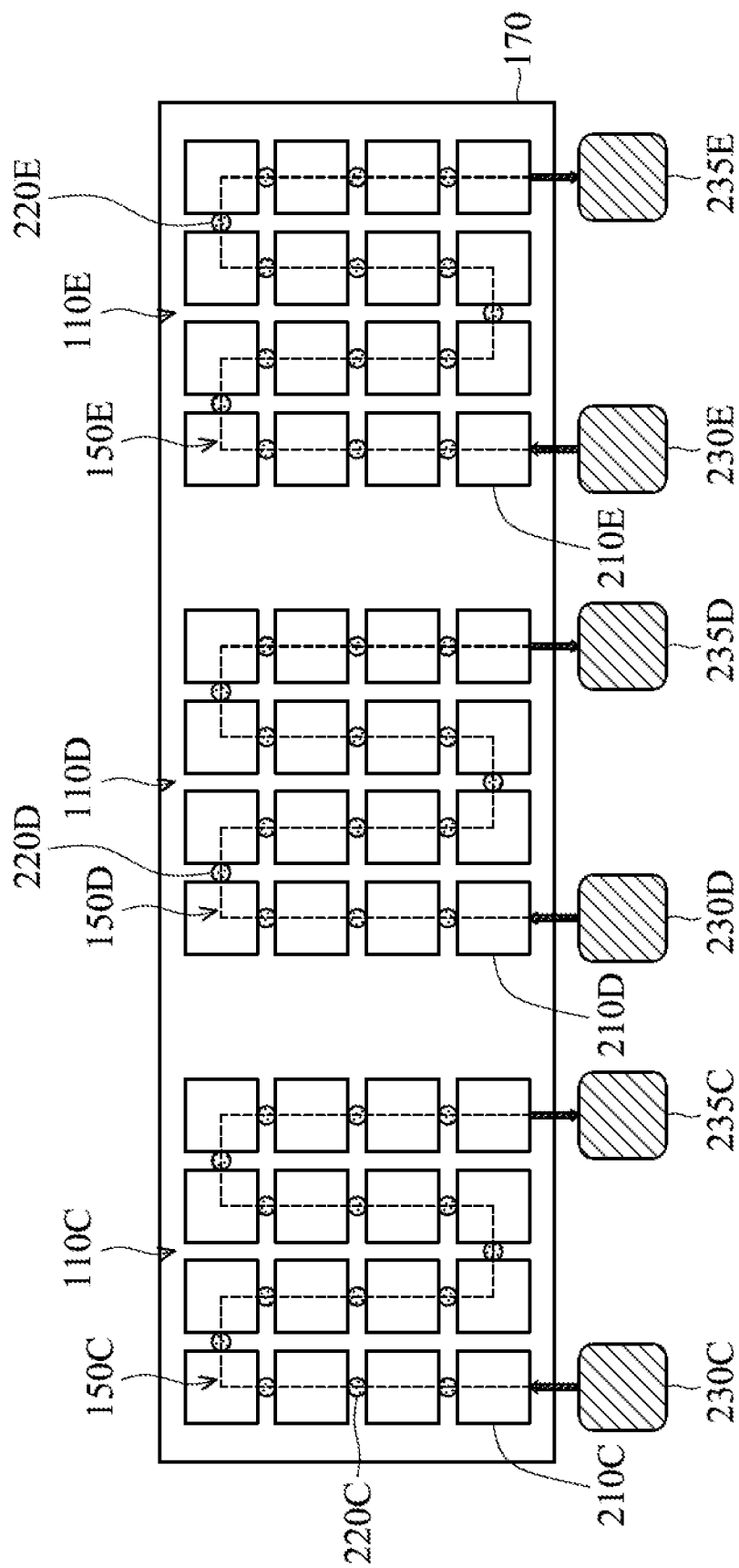
FIG. 7 shows a top view of a test range, in accordance with some embodiments of the disclosure.

FIG. 7 shows a top view of a semiconductor structure 170, in accordance with some embodiments of the disclosure. The semiconductor structure 170 includes the test line structures 110C through 110E, and the semiconductor structure 170 is implemented in a semiconductor wafer. In some embodiments, the semiconductor structure 170 is disposed in a scribe line of the semiconductor wafer. In some embodiments, the semiconductor structure 170 is disposed at the edge of the semiconductor wafer.

The test line structure 110C includes multiple diagnosis units 210C and multiple micro pad units 220C. Each diagnosis unit 210C includes an interconnect structure to be tested, and a routing path of the interconnect structure has the respective routing pattern formed by a first set of three consecutive metal layers. The test line structure 110D includes multiple diagnosis units 210D and multiple micro pad units 220D. Each diagnosis unit 210D includes an interconnect structure to be tested, and a routing path of the interconnect structure has the respective routing pattern formed by a second set of three consecutive metal layers. The test line structure 110E includes multiple diagnosis units 210E and multiple micro pad units 220E. Each diagnosis unit 210E includes an interconnect structure to be tested, and a routing path of the interconnect structure has the respective routing pattern formed by a third set of three consecutive metal layers.

The number of the diagnosis units in each test line structure is determined according to the constraints of the three consecutive metal layers. In FIG. 7, the number of the diagnosis units 210C, 210D and 210E in the test line structures 110C, 110D and 110E are the same. In some embodiments, the number of the diagnosis units 210C, 210D and 210E in the test line structures 110C, 110D and 110E are different.

In FIG. 7, each of the test line structures 110C through 110E is used to obtain the characteristics of different sets of three consecutive metal layers. Furthermore, the diagnosis units 210C through 210E have the same area. In some embodiments, the area of the diagnosis units 210C through 210E is determined according to resolution of a testing apparatus (e.g., 140 of FIG. 1) for the wafer acceptance test.

In the test line structure 110C, the diagnosis units 210C are connected in series to form a test chain 150C between the test pads 230C and 235C through the micro pad units 220C. The test pad 230C is an input pad and the test pad 235C is an output pad for testing the test chain 150C. In the test line structure 110D, the diagnosis units 210D are connected in series to form a test chain 150D between the test pads 230D and 235D through the micro pad units 220D. The test pad 230D is an input pad and the test pad 235D is an output pad for testing the test chain 150D. In the test line structure 110E, the diagnosis units 210E are connected in series to form a test chain 150E between the test pads 230E and 235E through the micro pad units 220E. The test pad 230E is an input pad and the test pad 235E is an output pad for testing the test chain 150E. The test chains 150C through 150E are separated from each other.

In a wafer acceptance test, a testing apparatus (e.g. 140 of FIG. 1) uses a probe card (e.g. 130 of FIG. 1) to simultaneously test the test line structures 110C through 110E. For example, a first pair of probes of the probe card is used to contact the test pads 230C and 235C for the test line structure 110C. A second pair of probes of the probe card is used to contact the test pads 230D and 235D for the test line structure 110D. A third pair of probes of the probe card is used to contact the test pads 230E and 235E for the test line structure 110E.

As described above, according to the signals from the test pads 235C through 235E, the testing apparatus analysis the signals to automatically identify or detect defects in the test line structures 110C through 110E, so as to tune the processing parameters for yield improvement.

Figure 8:
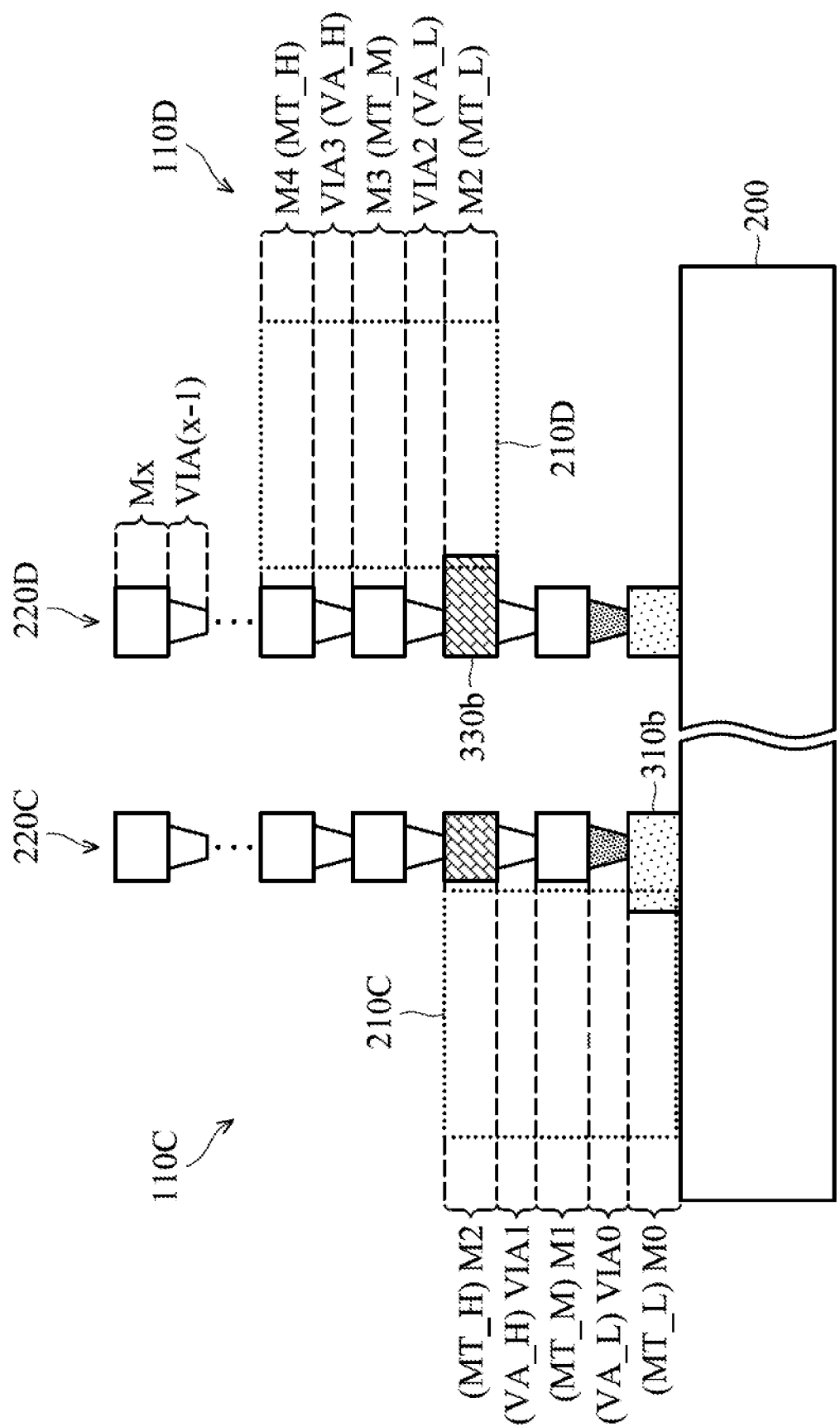
FIG. 8 illustrates a cross-sectional view of the test region of FIG. 7, in accordance with some embodiments of the disclosure.

FIG. 8 illustrates a cross-sectional view of the semiconductor structure 170 of FIG. 7, in accordance with some embodiments of the disclosure. In FIG. 8, the test line structure 110C includes the diagnosis unit 210C and the micro pad units 220C, and the test line structure 110D includes the diagnosis unit 210D and the micro pad units 220D. The number of diagnosis units and micro pad units are provided as an example, and are not intended to limit the disclosure.

In FIG. 8, the interconnect structure of the diagnosis unit 210C has the respective routing pattern between the three continuous metal layers M0 through M2, and the test line structure 110C is used to obtain the characteristics of the metal layers M0 through M2 and the via layers VIA0 and VIA1. Furthermore, the interconnect structure of the diagnosis unit 210D has the respective routing pattern between the three continuous metal layers M2 through M4, and the test line structure 110D is used to obtain the characteristics of the metal layers M2 through M4 and the via layers VIA2 and VIA3. In some embodiments, the routing patterns of the diagnosis units 210C and 210D are different since the constraints corresponding to the different metal layers may be different.

The micro pad unit 220C is formed over the semiconductor substrate 200 and coupled to the diagnosis unit 210C. Furthermore, the micro pad unit 220D is formed over the semiconductor substrate 200 and coupled to the diagnosis unit 210D. As described above, each of the micro pad units 220C and 220D has an interconnect structure formed by all metal layers and all via layers used in the related process. For example, the interconnect structures of the micro pad units 220C and 220D are formed from the lowermost metal layer M0 to the uppermost metal layer Mx through the metal layers M1 through M(x−1) and the via layers VIA0 through VIA(x−1).

In the test line structure 110C, the micro pad unit 220C is connected to the interconnect structure of the diagnosis unit 210C through the metal line 310$b$ in the metal layer M0. The micro pad unit 220D is connected to the interconnect structure of the diagnosis unit 210D through the metal line 330$b$ in the metal layer M2. As described above, the routing path between the metal lines and the vias in each interconnect structure of the diagnosis unit is formed according to APR routing layout. Thus, according to the routing result, the corresponding metal lines of each micro pad unit is arranged to connect the routing path of the diagnosis unit.

Figure 9:
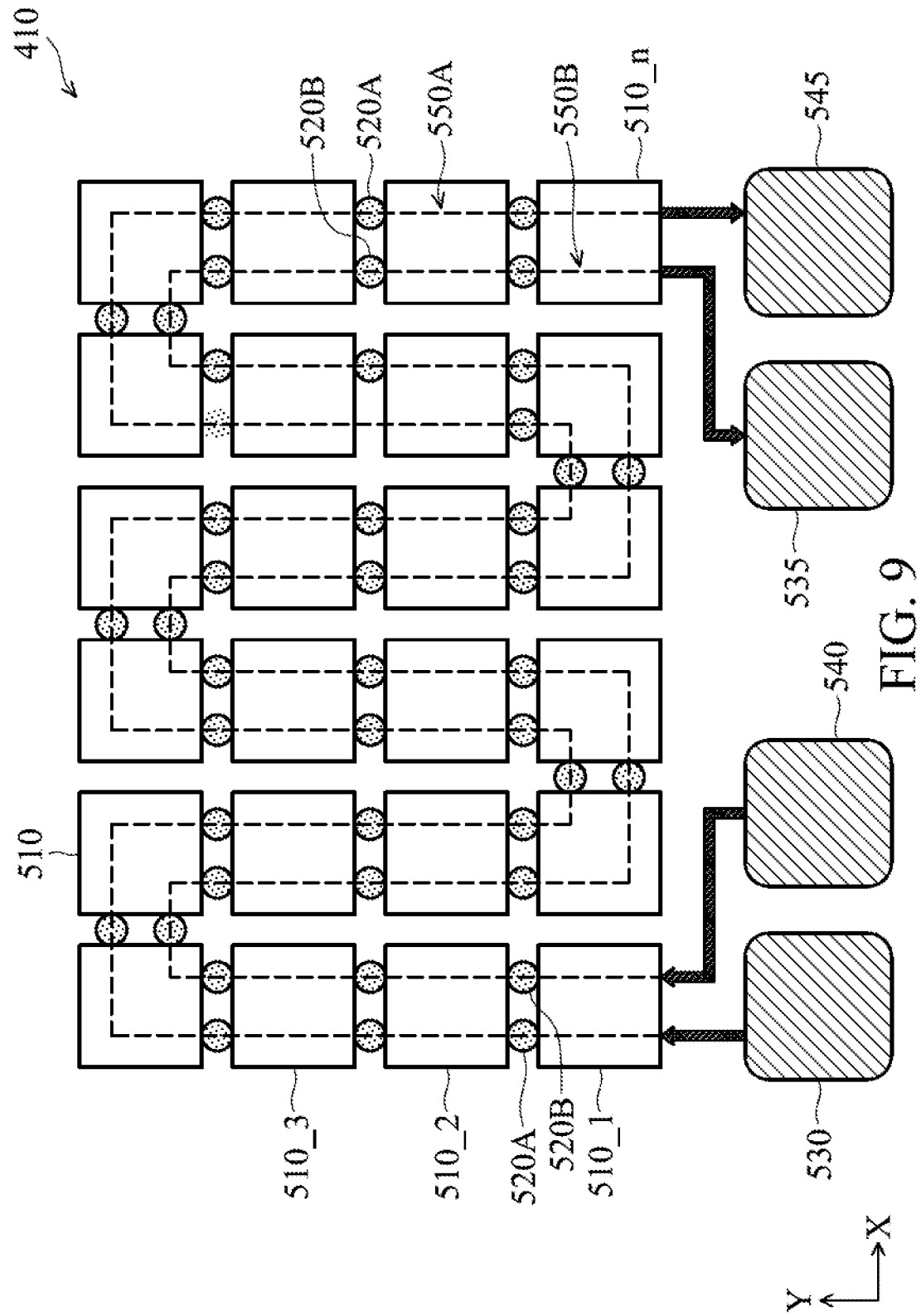
FIG. 9 shows a top view of a test line structure, in accordance with some embodiments of the disclosure.

FIG. 9 shows a top view of a test line structure 410, in accordance with some embodiments of the disclosure. Similar to the test line structure 110 of FIG. 1, the test line structure 410 is implemented in a semiconductor wafer (e.g., 100 of FIG. 1), and the test line structure 410 is used to obtain the characteristics of three consecutive metal layers and two via layers between the three consecutive metal layers.

The test line structure 410 includes multiple diagnosis units 510 and multiple micro pad units 520A and 520B. Each diagnosis unit 510 includes a first interconnect structure and a second interconnect structure to be tested, and a routing path of each of the first and second interconnect structures has a respective routing pattern formed by the three consecutive metal layers and the two via layers. Furthermore, the first interconnect structure is separated from the second interconnect structure. In some embodiments, the test line structure 410 is disposed in a scribe line of the semiconductor wafer. In some embodiments, the test line structure 410 is disposed in a test range at the edge of the semiconductor wafer. The details of the diagnosis unit 510 is described below.

In FIG. 9, each pair of micro pad units 520A and 520B is configured to connect the first and second interconnect structures of two adjacent diagnosis units 510. For example, the first interconnect structures of the diagnosis units 510 are connected in series to form a first test chain 550A between the test pads 530 and 535 through the micro pad units 520A. Furthermore, the second interconnect structures of the diagnosis units 510 are connected in series to form a second test chain 550B between the test pads 540 and 545 through the micro pad units 520B. Compared with the test line structure 110 that is configured to test a single test chain 150A, the diagnosis units 510 of the test line structure 110 is configured to test two test chains 550A and 550B.

In FIG. 9, the diagnosis unit 510_1 is the first diagnosis unit in the test chains 550A and 550B, and the diagnosis unit 510_n is the last diagnosis unit in the test chains 550A and 550B. As described above, the routing paths in the first interconnect structures of the diagnosis units 510 are connected in series to form the first test chain 550A by using the micro pad units 520A, and the routing paths in the second interconnect structures of the diagnosis units 510 are connected in series to form the second test chain 550B by using the micro pad units 520B.

The test pad 530 is an input pad and the test pad 535 is an output pad for testing the first test chain 550A, and the test pad 540 is an input pad and the test pad 545 is an output pad for testing the second test chain 550B. In a wafer acceptance test, a testing apparatus (e.g. 140 of FIG. 1) uses a probe card (e.g. 130 of FIG. 1) to test the test line structure 410. In the embodiment, a first probe and a second probe of the probe card are used to respectively contact the test pads 530 and 535 for the first test chain 550A. A third probe and a fourth probe of the probe card are used to contact the test pads 540 and 545 for the second test chain 550B.

In the wafer acceptance test, the testing apparatus provides a first signal (i.e., voltage signal) to the test pad 530 through the first probe of the probe card and a second signal to the test pad 540 through the third probe of the probe card. Furthermore, the first signal is the same as the second signal. When the first and second signals are provided into the diagnosis unit 510_1 through the test pads 530 and 540, the first signal is transferred in the routing path of the first interconnect structure of the diagnosis unit 510_1, and the second signal is transferred in the routing path of the second interconnect structure of the diagnosis unit 510_1. Next, the first and second signals then are provided to the diagnosis unit 510_2 (i.e., the next diagnosis unit) through the micro pad units 520A and 520B, respectively. Next, the first and second signals are transferred in the routing paths of the first and second interconnect structures of the diagnosis unit 510_2, and then the first and second signals are respectively provided to the diagnosis unit 510_3 through the micro pad units 520A and 520B, and so on. Finally, along the test chains 550A and 550B, the first and second signals are provided to the diagnosis unit 510_n. Next, the first and second signals are transferred in the routing paths of the first and second interconnect structures of the diagnosis unit 510_n, and then the first and second signals are provided to the test pads 535 and 545, respectively. The testing apparatus is configured to measure the first and second signals from the test pads 435 and 445 through the second and fourth probes of the probe card, respectively.

After obtaining the first signal from the test pad 535 and the second signal from the test pad 545, the testing apparatus analysis the difference between the obtained first and second signals to obtain resistor-capacitor (RC) characteristics (e.g., RC delay) or leakage information. If the difference exceeds a threshold value, the test line structure 410 is analyzed, so as to tune the processing parameters for yield improvement.

Figure 10A:
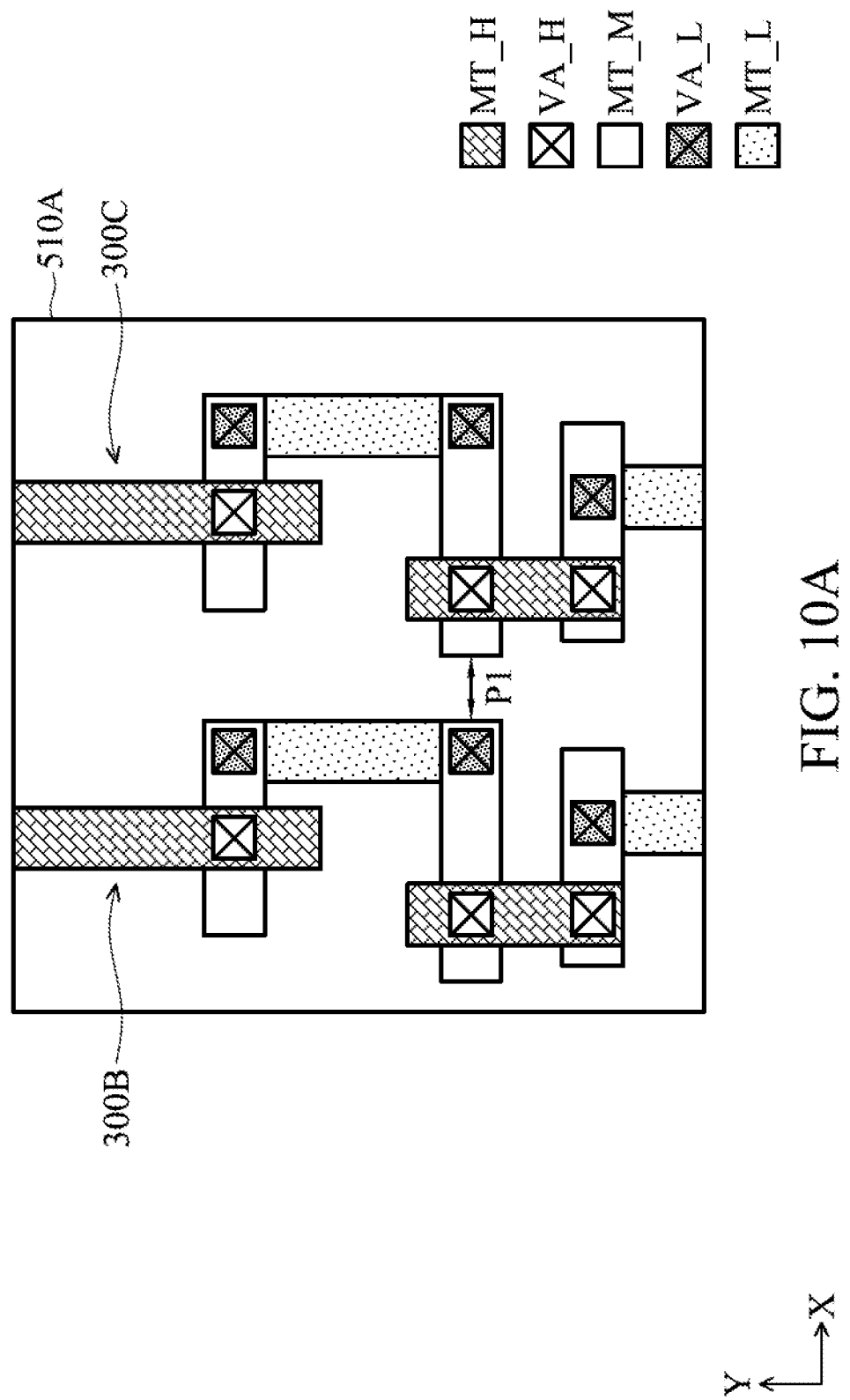
FIG. 10A shows a top view illustrating the interconnect structures of a diagnosis unit, in accordance with some embodiments of the disclosure.

FIG. 10A shows a top view illustrating the interconnect structures 300B and 300C of a diagnosis unit 510A, in accordance with some embodiments of the disclosure. A routing path of the interconnect structure 300B has a first routing pattern formed by the first metal layer MT_L, the second metal layer MT_M, the third metal layer MT_H, the first via layer VA_L and the second via layer VA_H. As described above, The first metal layer MT_L, the second metal layer MT_M and the third metal layer MT_H are three continuous metal layers. Furthermore, a routing path of the interconnect structure 300C also has a second routing pattern formed by the first metal layer MT_L, the second metal layer MT_M, the third metal layer MT_H, the first via layer VA_L and the second via layer VA_H. In the diagnosis unit 510A, the first routing pattern of the interconnect structure 300B is the same as the second routing pattern of the interconnect structure 300C. In some embodiments, the RC characteristics or leakage of the two test chains of the interconnect structures 300B and 300C is caused by a line pitch P1 between the interconnect structures 300B and 300C.

Figure 10B:
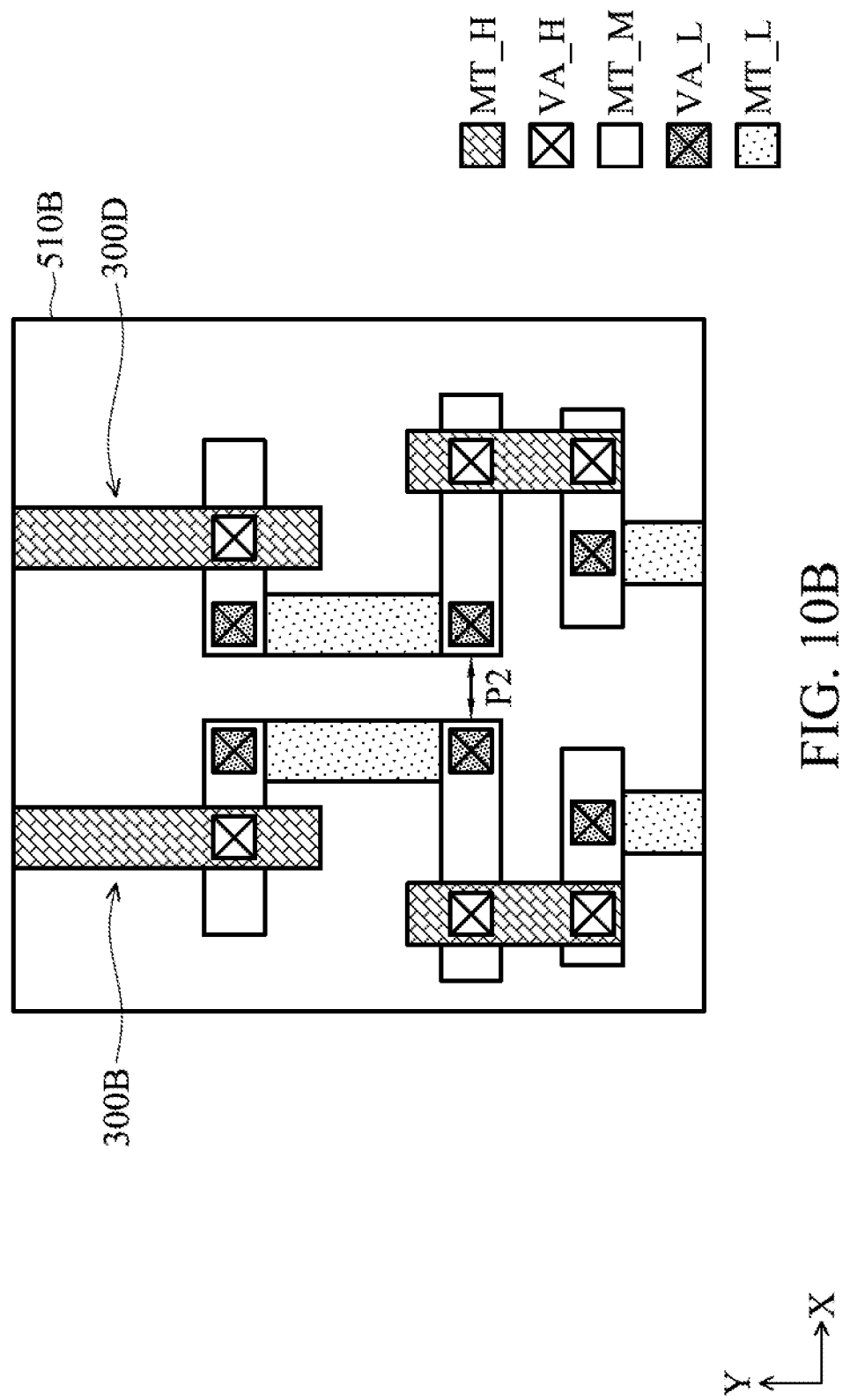
FIG. 10B shows a top view illustrating the interconnect structures of a diagnosis unit, in accordance with some embodiments of the disclosure.

FIG. 10B shows a top view illustrating the interconnect structures 300B and 300D of a diagnosis unit 510B, in accordance with some embodiments of the disclosure. A routing path of the interconnect structure 300D has a third routing pattern formed by the first metal layer MT_L, the second metal layer MT_M, the third metal layer MT_H, the first via layer VA_L and the second via layer VA_H. In the diagnosis unit 510B, the third routing pattern of the interconnect structure 300D is obtained by mirroring the first routing pattern of the interconnect structure 300B. In other words, the first and third routing patterns are arranged in mirror symmetry along the Y-direction. In some embodiments, the RC characteristics or leakage of the two test chains of the interconnect structures 300B and 300D is caused by a line pitch P2 between the interconnect structures 300B and 300D.

Figure 11:
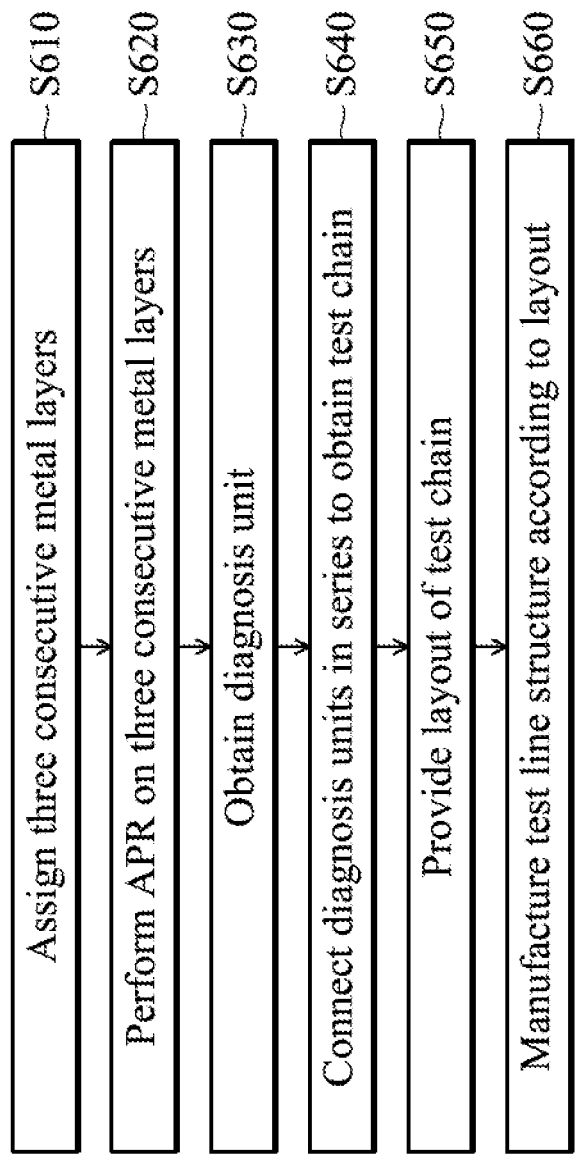
FIG. 11 shows a flowchart illustrating a method for forming a test line structure, in accordance with some embodiments of the disclosure.

FIG. 11 shows a flowchart illustrating a method for forming a test line structure, in accordance with some embodiments of the disclosure. First, in operation S610, three consecutive metal layers are assigned (e.g., selected from the lowermost of the metal layers to the uppermost metal layer). Next, in operation S620, according to various constraints corresponding to the assigned three consecutive metal layers and an area of the diagnosis unit, an APR procedure is performed to obtain various layouts of interconnect structures formed by the assigned three consecutive metal layers. Next, in operation S630, the diagnosis units are obtained from the interconnect structures with the layouts provided in operation S620. As described above, the interconnect structures of the diagnosis units have different routing patterns. Next, in operation S640, a test chain is provided by connecting the diagnosis units in series with the micro pad units. Next, in operation S650, a layout of the test line structure is provided according to the interconnect structures of the diagnosis units in the test chain. Thus, in operation S660, the test line structure is manufactured in a semiconductor wafer according to the layout of the test line structure.

Figure 12:
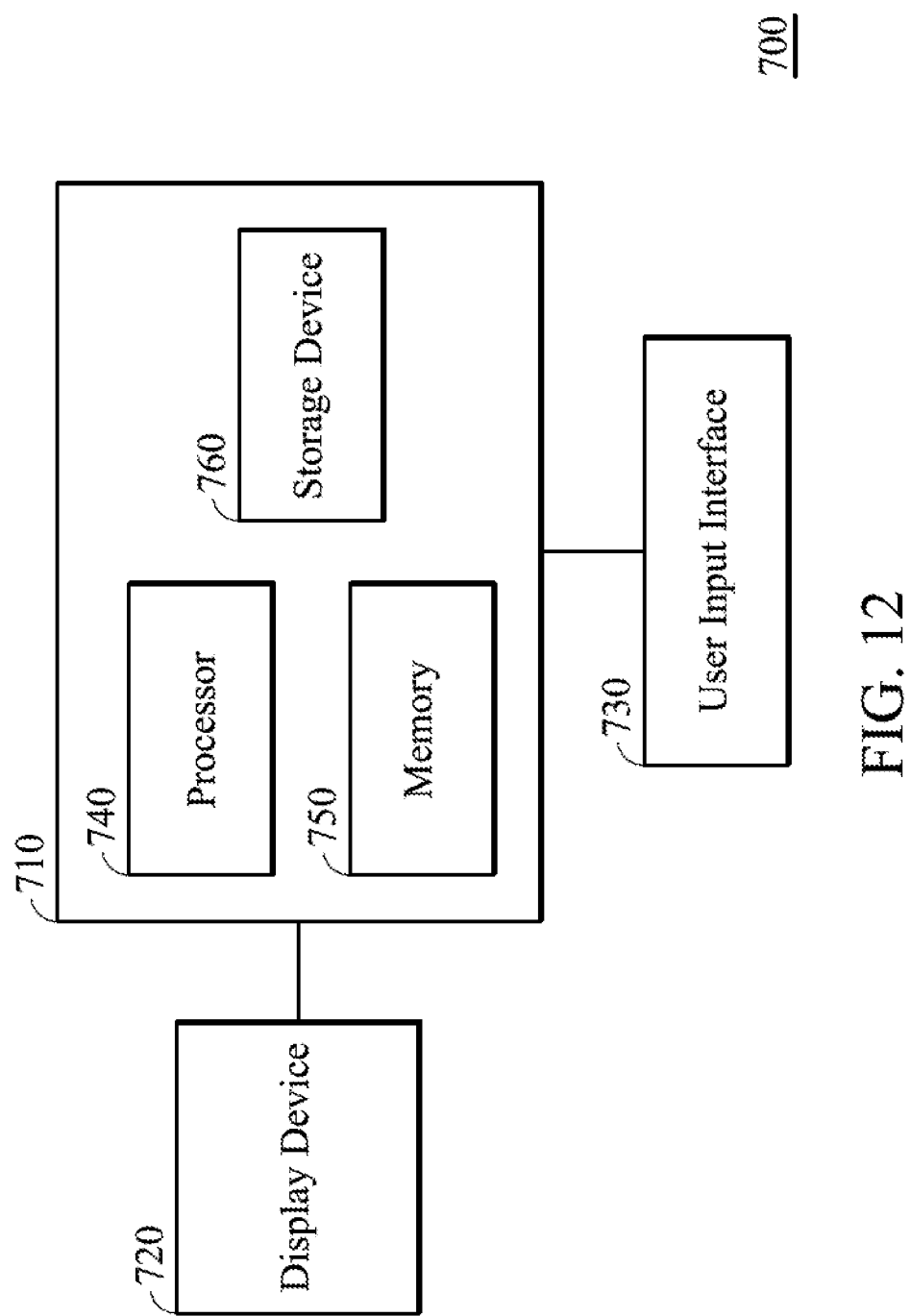
FIG. 12 shows a computer system, in accordance with some embodiments of the disclosure.

FIG. 12 shows a computer system 700, in accordance with some embodiments of the disclosure. The computer system 700 includes a computer 710, a display device 720 and a user input interface 730, wherein the computer 710 includes a processor 740, a memory 750, and a storage device 760. The computer 710 is coupled to the display device 720 and the user input interface 730, wherein the computer 510 is capable of operating an electronic design automation (EDA) tool. Furthermore, the computer 710 is capable of performing APR procedure and receiving the information regarding the layout and displaying the features of the layout on the display device 720. In some embodiments, the display device 720 is a GUI for the computer 710. Furthermore, the display device 720 and the user input interface 730 can be implemented in the computer 710. The user input interface 730 may be a keyboard, a mouse and so on. In the computer 710, the storage device 760 can store the operating systems (OSs), applications, and data that include input required by the applications and/or output generated by applications. The processor 740 of the computer 710 can perform one or more operations (either automatically or with user input), in any method that is implicitly or explicitly described in this disclosure. Furthermore, during operation, the processor 740 can load the applications of the storage device 760 into the memory 750, and then the applications can be used by a user to create, view, and/or edit the related placement and routing for IC design.

In some embodiments, the apparatus or manufacture including a computer useable or readable medium having control logic (software) stored thereon is also referred to herein as a computer program product or program storage device. This includes, but is not limited to, the computer system 700 and the memory 750, as well as tangible articles of manufacture embodying any combination of the foregoing. Such control logic, when executed by one or more data processing devices (such as computer system 700), causes such data processing devices to operate as described herein.

In some embodiments, the operations of FIG. 11, are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

The layout and the placement described in this disclosure can be partially or fully stored on a computer-readable storage medium and/or a hardware module and/or hardware apparatus. A computer-readable storage medium may be, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Examples of hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and operations described in this disclosure can be partially or fully embodied as code and/or data stored in a computer-readable storage medium or device, so that when a computer system reads and executes the code and/or data, the computer system performs the associated methods and processes. The methods and operations can also be partially or fully embodied in hardware modules or apparatuses, so that when the hardware modules or apparatuses are activated, they perform the associated methods and processes. Note that the methods and operations can be embodied using a combination of code, data, and hardware modules or apparatuses.

Embodiments of test line structures are provided. The test line structure includes at least one test chain formed by multiple diagnosis units connected in series with multiple micro pad units. Each diagnosis unit has a interconnect structure, and the interconnect structure has a specific routing pattern that is a routing path formed by three consecutive metal layers, and the routing path is formed according the APR routing layout. The routing patterns of the interconnect structures of the diagnosis units are different in the test chain. Compared with traditional test line in wafer acceptance test, the diagnosis units of the test chain is easy to check and analyze for physical failure analysis (PFA). Furthermore, the interconnects in BEOL can be independently verified without considering the characteristics and verification of the devices under the interconnects, thereby speeding up the learning cycle of BEOL process window and yield improvement.

In some embodiments, a test line structure is provided. The test line structure includes a semiconductor substrate, a plurality of diagnosis units, and a plurality of first micro pad units. The diagnosis units are formed over the semiconductor substrate. Each of the diagnosis units includes a first interconnect structure having a first routing pattern. The first interconnect structures of the diagnosis units are connected in series to form a first test chain through the first micro pad units, and each of the first micro pad units is configured to connect the first interconnect structures of two adjacent diagnosis units. The first routing patterns of the first interconnect structures in the diagnosis units are different.

In some embodiments, a semiconductor structure is provided. The semiconductor structure includes a semiconductor substrate, a first test line structure and a second test line structure. The first test line structure includes a plurality of first diagnosis units over the semiconductor substrate and a plurality of first micro pad units. The second test line structure includes a plurality of second diagnosis units over the first diagnosis units and a plurality of second micro pad units. Each of the first diagnosis units includes a first interconnect structure having a first routing pattern. Each of the first micro pad units is configured to connect the first interconnect structures of two adjacent first diagnosis units. Each of the second diagnosis units includes a second interconnect structure having a second routing pattern. Each of the second micro pad units is configured to connect the second interconnect structures of two adjacent second diagnosis units of the second diagnosis units. The first routing patterns of the first interconnect structures in the first diagnosis units are different, and the second routing patterns of the second interconnect structures in the second diagnosis units are different.

In some embodiments, a method for forming a test line structure is provided. The method includes assigning three consecutive metal layers from a plurality of metal layers. The method further includes performing placement and routing on the assigned three consecutive metal layers to provide a plurality of diagnosis units. Each of the diagnosis units includes an interconnect structure having a respective routing pattern. The method further includes connecting the diagnosis units in series to provide a test chain. The method further includes providing a layout according to the interconnect structures of the diagnosis units in the test chain. The method further includes manufacturing a semiconductor wafer according to the layout.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A test line structure, comprising:
a semiconductor substrate;
a plurality of diagnosis units over the semiconductor substrate, each comprising:
a first interconnect structure having a first routing pattern; and
a plurality of first micro pad units,
wherein the first interconnect structures of the diagnosis units are connected in series to form a first test chain through the first micro pad units, and each of the first micro pad units is configured to connect the first interconnect structures of two adjacent diagnosis units in the first test chain,
wherein the first routing patterns of the first interconnect structures in the diagnosis units are different.

2. The test line structure as claimed in claim 1, wherein the first interconnect structure comprises:
a plurality of first metal lines formed in a first metal layer over the semiconductor substrate;
a plurality of second metal lines formed in a second metal layer over the first metal layer;
a plurality of third metal lines formed in a third metal layer over the second metal layer;
a plurality of first vias formed in a first via layer between the first and second metal layers, wherein each of the first vias is configured to connect the first metal line and the second metal line corresponding to the first via; and
a plurality of second vias formed in a second via layer between the second and third metal layers, wherein each of the second vias is configured to connect the second metal line and the third metal line corresponding to the second via,
wherein the first, second and third metal lines and the first and second vias form a first conductive path having the first routing pattern.

3. The test line structure as claimed in claim 2, wherein each of the first micro pad units is further configured to connect the first conductive paths of the two adjacent diagnosis units in the first test chain, and the first conductive paths in the diagnosis units are connected in series to form the first test chain through the first micro pad units.

4. The test line structure as claimed in claim 1, further comprising:
a first test pad formed in a top metal layer; and
a second test pad formed in the top metal layer,
wherein the first test pad is connected to a first diagnosis unit of the first test chain, and the second test pad is connected to the last diagnosis unit in the first test chain.

5. The test line structure as claimed in claim 1, wherein each of the diagnosis units further comprises:
a second interconnect structure having a second routing pattern; and
a plurality of second micro pad units,
wherein the second interconnect structures of the diagnosis units are connected in series to form a second test chain through the second micro pad units, and each of the second micro pad units is configured to connect the second interconnect structures of two adjacent diagnosis units in the second test chain,
wherein the second routing patterns of the second interconnect structures are different in the diagnosis units.

6. The test line structure as claimed in claim 5, wherein in each of the diagnosis units, the first interconnect structure is separated from the second interconnect structure.

7. The test line structure as claimed in claim 5, further comprising:
a first test pad formed in a top metal layer;
a second test pad formed in the top metal layer;
a third test pad formed in the top metal layer; and
a fourth test pad formed in the top metal layer;
wherein the first test pad is connected to the first interconnect structure of a first diagnosis unit in the first test chain, and the second test pad is connected to the first interconnect structure of the last diagnosis unit in the first test chain,
wherein the third test pad is connected to the second interconnect structure of the first diagnosis unit in the second test chain, and the fourth test pad is connected to the second interconnect structure of the last diagnosis unit in the second test chain,
wherein the second test chain is separated from the first test chain.

8. The test line structure as claimed in claim 5, wherein in each of the diagnosis units, the second routing pattern is the same as the first routing pattern.

9. A semiconductor structure, comprising:
a semiconductor substrate;
a first test line structure, comprising:
a plurality of first diagnosis units over the semiconductor substrate, each comprising:
a first interconnect structure having a first routing pattern; and
a plurality of first micro pad units, each configured to connect the first interconnect structures of two adjacent first diagnosis units of the first diagnosis units; and
a second test line structure, comprising:
a plurality of second diagnosis units over the first diagnosis units, each comprising:
a second interconnect structure having a second routing pattern; and
a plurality of second micro pad units, each configured to connect the second interconnect structures of two adjacent second diagnosis units of the second diagnosis units,
wherein the first routing patterns of the first interconnect structures in the first diagnosis units are different, and the second routing patterns of the second interconnect structures in the second diagnosis units are different.

10. The semiconductor structure as claimed in claim 9, wherein the first interconnect structure of the first diagnosis units are connected in series to form a first chain through the first micro pad units, and the second interconnect structure of the second diagnosis units are connected in series to form a second test chain through the second micro pad units, wherein the first test chain is separated from the second test chain.

11. The semiconductor structure as claimed in claim 9, wherein the first interconnect structure is formed by a first set of three consecutive metal layers, and the second interconnect structure is formed by a second set of three consecutive metal layers that is different from the first set of three consecutive metal layers.

12. The semiconductor structure as claimed in claim 11, further comprising:
a first test pad formed in a top metal layer;
a second test pad formed in the top metal layer;
a third test pad formed in the top metal layer; and a fourth test pad formed in the top metal layer, wherein the first test pad is connected to a first unit of the first diagnosis units in the first test chain, and the second test pad is connected to the last unit of the first diagnosis units in the first test chain, wherein the third test pad is connected to a first unit of the second diagnosis units in the second test chain, and the fourth test pad is connected to the last unit of the second diagnosis units in the second test chain.

13. The semiconductor as claimed in claim 12, wherein when a first signal is provided to the first test pad, characteristics of the first set of three consecutive metal layers are obtained from a second signal from the second test pad, and when a third signal is provided to the third test pad, characteristics of the second set of three consecutive metal layers are obtained from a fourth signal from the fourth test pad.

14. The semiconductor as claimed in claim 11, wherein the first routing pattern is obtained from an auto placement and routing (APR) routing layout corresponding to the first set of three consecutive metal layers, and the second routing pattern is obtained from an APR routing layout corresponding to the second set of three consecutive metal layers, and the first routing pattern is different from the second routing pattern.

15. A semiconductor structure, comprising:
a semiconductor substrate;
a plurality of diagnosis units over the semiconductor substrate, each comprising:
a first interconnect structure having a first routing pattern; and
a second interconnect structure having a second routing pattern corresponding to the first routing pattern;
a plurality of first micro pad units; and
a plurality of second micro pad units, wherein the first interconnect structures of the diagnosis units are connected in series to form a first test chain through the first micro pad units, and the second interconnect structures of the diagnosis units are connected in series to form a second test chain through the second micro pad units, wherein in each of the diagnosis units, the first interconnect structure is separated from the second interconnect structure.

16. The semiconductor as claimed in claim 15, wherein each of the first micro pad units is configured to connect the first interconnect structures of two adjacent diagnosis units in the first test chain, and each of the second micro pad units is configured to connect the second interconnect structures of two adjacent diagnosis units in the second test chain.

17. The semiconductor as claimed in claim 16, wherein the first micro pad units and the second micro pad units have the same number.

18. The semiconductor as claimed in claim 15, wherein each of the first interconnect structures has a respective first routing pattern, and each of the second interconnect structures has a respective second routing pattern.

19. The semiconductor as claimed in claim 18, wherein in each of the diagnosis units, the first routing pattern of the first interconnect structure is the same as the second routing pattern of the second interconnect structure.

20. The semiconductor as claimed in claim 18, wherein in each of the diagnosis units, the first routing pattern of the first interconnect structure and the second routing pattern of the second interconnect structure are arranged in mirror symmetry.

* * * * *